United States Patent
Schulz

(10) Patent No.: US 11,664,335 B2
(45) Date of Patent: May 30, 2023

(54) POWER SEMICONDUCTOR CHIP, METHOD FOR PRODUCING A POWER SEMICONDUCTOR CHIP, AND POWER SEMICONDUCTOR DEVICE

(71) Applicant: Semikron Elektronik GmbH & Co., KG, Nuremberg (DE)

(72) Inventor: Wolfgang-Michael Schulz, Zirndorf (DE)

(73) Assignee: Semikron Elektronik GmbH & Co., KG, N ürnberg (DE)

( * ) Notice: Subject to any disclaimer, the term of this patent is extended or adjusted under 35 U.S.C. 154(b) by 0 days.

(21) Appl. No.: 15/358,038

(22) Filed: Nov. 21, 2016

(65) Prior Publication Data
US 2019/0148318 A1    May 16, 2019

(30) Foreign Application Priority Data

Nov. 20, 2015 (DE) .................... 10 2015 120 161.5
Sep. 15, 2016 (DE) .................... 10 2016 117 389.4

(51) Int. Cl.
*H01L 23/00* (2006.01)
*H01L 23/488* (2006.01)

(52) U.S. Cl.
CPC ............ *H01L 24/05* (2013.01); *H01L 23/488* (2013.01); *H01L 24/03* (2013.01); *H01L 24/08* (2013.01);

(Continued)

(58) Field of Classification Search
CPC ....... H01L 24/05; H01L 23/488; H01L 24/03; H01L 24/08; H01L 24/48; H01L 24/85; H01L 24/45; H01L 2224/0345; H01L 2224/03462; H01L 2224/0347; H01L 2224/03823; H01L 2224/04042;
(Continued)

(56) References Cited

U.S. PATENT DOCUMENTS 4,594,602 A * 6/1986 Iimura .................. H01L 29/861
257/610
5,801,436 A * 9/1998 Serizawa .......... H01L 23/49582
257/766

(Continued)

FOREIGN PATENT DOCUMENTS

| CN | 103928436 A | 7/2014 |
|---|---|---|
| CN | 206282846 U | 6/2017 |
| DE | 102014200242 | 7/2014 |

OTHER PUBLICATIONS

Chinese Patent Office Office Action in parallel application, dated Dec. 28, 2020.

*Primary Examiner* — Duy T Nguyen
(74) *Attorney, Agent, or Firm* — The Law Offices of Roger S. Thompson

(57) ABSTRACT

A power semiconductor chip having: a semiconductor component body; a multilayer metallization arranged on the semiconductor component body; and a nickel layer arranged over the semiconductor component body. The invention further relates to a method for producing a power semiconductor chip and to a power semiconductor device. The invention provides a power semiconductor chip which has a metallization to which a copper wire, provided without a thick metallic coating, can be reliably bonded without damage to the power semiconductor chip during bonding.

5 Claims, 1 Drawing Sheet

(52) U.S. Cl.
CPC .............. *H01L 24/48* (2013.01); *H01L 24/85* (2013.01); *H01L 24/45* (2013.01); *H01L 2224/0345* (2013.01); *H01L 2224/0347* (2013.01); *H01L 2224/03462* (2013.01); *H01L 2224/03823* (2013.01); *H01L 2224/04042* (2013.01); *H01L 2224/05005* (2013.01); *H01L 2224/0508* (2013.01); *H01L 2224/0516* (2013.01); *H01L 2224/05023* (2013.01); *H01L 2224/0558* (2013.01); *H01L 2224/0566* (2013.01); *H01L 2224/05118* (2013.01); *H01L 2224/05124* (2013.01); *H01L 2224/05139* (2013.01); *H01L 2224/05147* (2013.01); *H01L 2224/05155* (2013.01); *H01L 2224/05164* (2013.01); *H01L 2224/05166* (2013.01); *H01L 2224/05171* (2013.01); *H01L 2224/05172* (2013.01); *H01L 2224/05179* (2013.01); *H01L 2224/05184* (2013.01); *H01L 2224/05186* (2013.01); *H01L 2224/05583* (2013.01); *H01L 2224/05618* (2013.01); *H01L 2224/05624* (2013.01); *H01L 2224/05639* (2013.01); *H01L 2224/05644* (2013.01); *H01L 2224/05647* (2013.01); *H01L 2224/05664* (2013.01); *H01L 2224/05666* (2013.01); *H01L 2224/05671* (2013.01); *H01L 2224/05672* (2013.01); *H01L 2224/05679* (2013.01); *H01L 2224/05684* (2013.01); *H01L 2224/08503* (2013.01); *H01L 2224/45005* (2013.01); *H01L 2224/45015* (2013.01); *H01L 2224/4554* (2013.01); *H01L 2224/45147* (2013.01); *H01L 2224/4847* (2013.01); *H01L 2224/48247* (2013.01); *H01L 2224/48506* (2013.01); *H01L 2224/48507* (2013.01); *H01L 2224/48855* (2013.01); *H01L 2224/85205* (2013.01); *H01L 2224/85375* (2013.01); *H01L 2924/00014* (2013.01)

(58) Field of Classification Search
CPC . H01L 2224/05005; H01L 2224/05023; H01L 2224/0508; H01L 2224/05118; H01L 2224/05124; H01L 2224/05139; H01L 2224/05147; H01L 2224/05155; H01L 2224/0516; H01L 2224/05164; H01L 2224/05166; H01L 2224/05171; H01L 2224/05172; H01L 2224/05179; H01L 2224/05184; H01L 2224/05186; H01L 2224/0558; H01L 2224/05583; H01L 2224/05618; H01L 2224/05624; H01L 2224/05639; H01L 2224/05644; H01L 2224/05647; H01L 2224/0566; H01L 2224/05664; H01L 2224/05666; H01L 2224/05671; H01L 2224/05672; H01L 2224/05679; H01L 2224/05684; H01L 2224/08503; H01L 2224/45005; H01L 2224/45015; H01L 2224/45147; H01L 2224/4554; H01L 2224/48247; H01L 2224/4847; H01L 2224/48506; H01L 2224/48507; H01L 2224/48855; H01L 2224/85205; H01L 2224/85375; H01L 2924/00014; H01L 23/49; H01L 24/43; H01L 24/80; H01L 2224/4503; H01L 2224/45118; H01L 2224/45124; H01L 2224/45139; H01L 2224/4516; H01L 2224/45163; H01L 2924/01013; H01L 2924/01026; H01L 2924/01029; H01L 2924/0103; H01L 2924/01046; H01L 2924/01047
USPC ........................................................ 257/761
See application file for complete search history.

(56) References Cited

U.S. PATENT DOCUMENTS

| | | | |
|---|---|---|---|
| 5,994,212 A * | 11/1999 | Arakawa | H01L 21/4825 257/673 |
| 6,164,523 A | 12/2000 | Fauty et al. | |
| 7,285,845 B2 * | 10/2007 | Kang | H01L 23/49582 257/677 |
| 9,059,003 B2 * | 6/2015 | Tatsumi | H01L 24/03 |
| 9,059,185 B2 * | 6/2015 | Abbott | H01L 21/56 |
| 2003/0207572 A1 * | 11/2003 | Yoshinori | H01L 23/562 438/689 |
| 2004/0245320 A1 * | 12/2004 | Fukagaya | H01L 24/43 228/110.1 |
| 2007/0026631 A1 | 2/2007 | Lin | |
| 2007/0045615 A1 * | 3/2007 | Cho | B82Y 10/00 257/40 |
| 2007/0284415 A1 | 12/2007 | Hosseini | |
| 2008/0030836 A1 * | 2/2008 | Tonar | B60R 1/084 359/271 |
| 2008/0054441 A1 | 3/2008 | Lin | |
| 2008/0182360 A1 * | 7/2008 | Lin | H01L 21/568 438/108 |
| 2009/0174053 A1 * | 7/2009 | Ikenaga | H01L 21/568 257/690 |
| 2009/0188696 A1 * | 7/2009 | Uno | B23K 20/004 174/126.2 |
| 2010/0181675 A1 * | 7/2010 | Reynoso | H01L 23/4952 257/762 |
| 2010/0282495 A1 * | 11/2010 | Uno | B23K 35/24 174/126.2 |
| 2011/0075451 A1 * | 3/2011 | Bayerer | H01L 24/06 363/37 |
| 2011/0120594 A1 * | 5/2011 | Uno | B32B 15/018 148/23 |
| 2011/0133319 A1 * | 6/2011 | Sirinorakul | H01L 21/4832 257/669 |
| 2011/0253191 A1 * | 10/2011 | Kutzer | H01L 31/0504 136/244 |
| 2012/0181676 A1 * | 7/2012 | Tsui | H01L 24/27 257/675 |
| 2013/0017652 A1 * | 1/2013 | Tsui | H01L 24/73 438/119 |
| 2013/0280838 A1 * | 10/2013 | Shin | H01L 29/66742 438/34 |
| 2013/0320524 A1 | 12/2013 | Chuang et al. | |
| 2014/0175628 A1 * | 6/2014 | Pan | H01L 24/37 257/676 |
| 2014/0197539 A1 | 7/2014 | Bayerer | |
| 2014/0306333 A1 * | 10/2014 | Fan | H01L 23/49551 257/676 |
| 2014/0327018 A1 * | 11/2014 | Tatsumi | H01L 24/45 257/77 |
| 2015/0001726 A1 * | 1/2015 | Lee | H01L 27/04 257/762 |
| 2015/0188080 A1 * | 7/2015 | Choi | H01L 51/0097 257/88 |
| 2015/0262924 A1 * | 9/2015 | Tiu | H01L 23/49558 257/676 |
| 2019/0148318 A1 * | 5/2019 | Schulz | H01L 24/48 257/761 |

* cited by examiner

POWER SEMICONDUCTOR CHIP, METHOD FOR PRODUCING A POWER SEMICONDUCTOR CHIP, AND POWER SEMICONDUCTOR DEVICE

BACKGROUND OF THE INVENTION

1. Field of the Invention

The invention is directed to a power semiconductor chip, to a method for producing a power semiconductor chip, and to a power semiconductor device.

2. Description of the Related Art

Electrical connection of power semiconductor chips to the outside world is normally achieved in the art by ultrasonic bonding, in which an aluminum wire is bonded to an aluminum metallization of the power semiconductor chip. With ultrasonic bonding, the aluminum wire is fused to the aluminum metallization of the power semiconductor chip by exposure to pressure and vibration. In this process, a friction weld connection is formed between aluminum wire and the aluminum metallization of the power semiconductor chip.

In view of the greater electrical conductivity of copper relative to aluminum, and of the lower attendant electrical losses, it is technically advantageous to use a copper wire rather than the aluminum wire, and hence to use a copper wire for the ultrasonic bonding. Given that a copper wire has a greater hardness than the aluminum metallization of the power semiconductor chip, and in view of the necessary exposure of the copper wire to pressure in the direction of the aluminum metallization of the power semiconductor chip in the course of bonding, it is possible for damage to occur to the semiconductor region of the power semiconductor chip that is disposed beneath the aluminum metallization.

In order to avoid this damage, German Patent Application No. DE 10 2006 023 167 B3 proposes carrying out bonding using a copper wire provided with a thick metallic coating (e.g., aluminum), the metallic coating having a lower hardness than the copper wire. In the bonded connection, the copper wire is fused to the aluminum metallization of the power semiconductor chip via the thick metallic coating of the copper wire, which is arranged between the copper wire and the aluminum metallization of the power semiconductor chip. The thick metallic coating of a metal which is soft relative to the copper wire acts as an elastic mechanical buffer during bonding, reducing a high local pressure load on the power semiconductor chip that occurs during bonding of the copper wire. A disadvantage here is that the production of a copper wire provided with a thick metallic coating of this kind is technically costly and inconvenient.

SUMMARY OF THE INVENTION

It is an object of the invention is to provide an improved power semiconductor chip having a metallization to which a copper wire, provided without a thick metallic coating, can be reliably bonded thereto, without damage occurring to the power semiconductor chip in the course of bonding.

This object is achieved by a power semiconductor chip having a semiconductor component body and having a multilayer metallization which is arranged on the semiconductor component body and which has a nickel layer arranged over the semiconductor component body.

This object is achieved, furthermore, by a method for producing a power semiconductor chip, comprising the following method steps:
a) providing a semiconductor component body,
b) applying an aluminum-containing first metal layer to the semiconductor component body,
c) performing one of the following three method steps:
applying a second metal layer, which comprises at least one of chromium, niobium and vanadium, to said first metal layer, and applying a third metal layer, which comprises at least one of copper, silver, palladium, iron and zinc, to said second metal layer, and applying, by current-based electroplating, a nickel layer to said third metal layer;
applying a second metal layer, which comprises at least one of chromium, niobium and vanadium, to said first metal layer, and applying an interlayer which comprises at least one of nickel, titanium, titanium nitride, tungsten and tungsten nitride to said second metal layer, and applying a third metal layer, which comprises at least one of copper, silver, palladium, iron and zinc, to said interlayer, and applying, by current-based electroplating, a nickel layer to said third metal layer; and
applying, by current-based electroplating, a nickel layer to said first metal layer.

It is more particularly an object of the invention to provide a power semiconductor device comprising a power semiconductor chip and a copper wire, in which the copper wire is bonded, more particularly ultrasonically bonded, to the metallization of the power semiconductor chip, the bonded connection of the copper wire with the metallization of the power semiconductor chip being highly mechanically robust.

Advantageous developments of the method will become apparent in analogy to advantageous developments of the power semiconductor chip, and vice versa.

It proves to be advantageous if the metallization has an aluminum-containing first metal layer which is arranged on the semiconductor component body, the nickel layer being arranged over the first metal layer. The first metal layer may more particularly be arranged on the semiconductor material of the semiconductor component body and may therefore have mechanical contact with the semiconductor material of the semiconductor component body.

It proves further to be advantageous if the metallization has a second metal layer, which comprises chromium, niobium or vanadium, and a third metal layer, which is arranged on the second metal layer and comprises copper, silver, palladium, iron or zinc, the nickel layer being arranged on the third metal layer. By this means, a highly mechanically robust layer sequence is provided.

It proves further to be advantageous if the metallization has a second metal layer, which comprises chromium, niobium or vanadium, and an interlayer, which is arranged on the second metal layer and which consists of nickel, titanium, titanium nitride, tungsten or tungsten nitride, and a third metal layer, which is arranged on the interlayer and comprises copper, silver, palladium, iron or zinc, the nickel layer being arranged on the third metal layer. By this means a very highly mechanically robust layer sequence is provided. If the second metal layer takes the form of a chromium layer and the third metal layer takes the form of a silver layer, and if the interlayer consists of nickel, an extremely highly mechanically robust layer sequence is provided.

In this context it proves to be advantageous if the interlayer has a thickness of from about 200 nm to about 3000 nm, since this thickness represents a technically particularly effective thickness of the interlayer.

It proves further to be advantageous if the metallization has an aluminum-containing first metal layer arranged on the semiconductor component body, the second metal layer being arranged on the first metal layer. The interlayer sequence, consisting of the second and third metal layers or of the second metal layer, the interlayer and the third metal layer, allows mechanically very stable indirect joining of the nickel layer to the first metal layer. The first metal layer may more particularly be arranged on the semiconductor material of the semiconductor component body, and may therefore have mechanical contact with the semiconductor material of the semiconductor component body.

It proves further to be advantageous if the metallization has a palladium layer arranged on the nickel layer, since in that case the nickel layer is very well protected against oxidation.

In this connection it proves to be advantageous if the metallization has a gold layer arranged on the palladium layer. The gold layer reliably prevents catalytic accumulation of carbon on the palladium.

It proves further to be advantageous if the metallization has a gold layer arranged on the nickel layer, since in that case the nickel layer is well protected against oxidation.

It proves further to be advantageous if the nickel layer has a thickness of at least about 5 μm and more particularly a thickness of at least about 10 μm, since in that case the nickel layer is particularly highly mechanically robust. The nickel layer may for example have a thickness of from about 5 μm to about 50 μm.

It proves to be advantageous, moreover, if the second metal layer has a thickness of from about 10 nm to about 100 nm, since this thickness represents a technically particularly effective thickness of the second metal layer.

It proves to be advantageous, moreover, if the third metal layer has a thickness of from about 100 nm to about 2000 nm, since this thickness represents a technically particularly effective thickness of the third metal layer.

It proves further to be advantageous for a power semiconductor device to have a power semiconductor chip of the invention and a copper wire, the copper wire being bonded, more particularly ultrasonically bonded, to the nickel layer of the metallization, the copper of the copper wire having contact with the nickel of the nickel layer, since a copper wire joins to the nickel layer very reliably by a bonded connection, more particularly by an ultrasonically bonded connection.

It proves further to be advantageous if a palladium layer is applied to the nickel layer, since in that case the nickel layer is very well protected against oxidation.

In this connection it proves to be advantageous if a gold layer is applied to the palladium layer. The gold layer reliably prevents catalytic accumulation of carbon on the palladium.

It proves further to be advantageous if a gold layer is applied to the nickel layer, since in that case the nickel layer is well protected against oxidation.

It proves advantageous, furthermore, for a method for producing a power semiconductor device, the method comprising a method of the invention for producing a power semiconductor chip, to comprise the following further method step, taking place after the method for producing the power semiconductor chip, the layers, more particularly metal layers, applied during the method for producing the power semiconductor chip, together forming a metallization:

bonding, more particularly ultrasonically bonding, a copper wire to the nickel layer of the metallization, the copper of the copper wire having contact with the nickel of the nickel layer.

A copper wire joins very reliably to the nickel layer by a bonded connection, more particularly by an ultrasonically bonded connection.

Other objects and features of the present invention will become apparent from the following detailed description of the presently preferred embodiments, considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
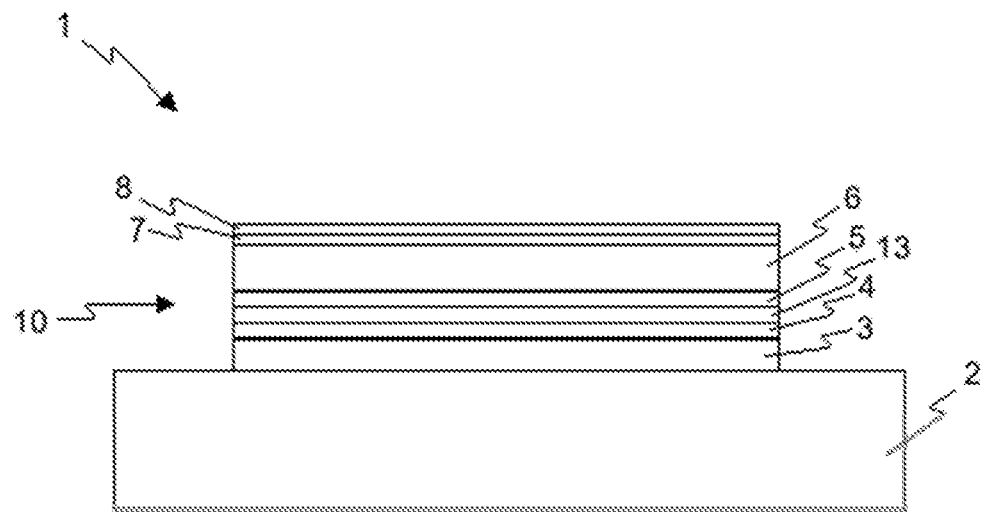
FIG. 1 shows a sectional view of the power semiconductor chip of the invention.

FIG. 1 shows a sectional view of a power semiconductor chip 1 made in accordance with the invention. Power semiconductor chip 1 has a semiconductor component body 2 on which a multilayer metallization 10 is arranged. Metallization 10 has a nickel layer 6 arranged over semiconductor component body 2. Between semiconductor component body 2 and nickel layer 6, metallization 10 may have an arbitrary number of electrically conducting layers, more particularly metal layers. The purpose of metallization 10 is to connect power semiconductor chip 1 electrically to the outside world.

Semiconductor component body 2 may take the form, for example, of a diode, transistor or thyristor. Semiconductor component body 2 comprises a semiconductor material such as silicon or silicon carbide, for example. Semiconductor component body 2 consists preferably at least substantially of a semiconductor material such as silicon or silicon carbide, for example. Arranged on the semiconductor material, as constituent(s) of semiconductor component body 2, there may be one single or a plurality of electrically insulating layer(s), such as oxide layers or polyimide layers, for example. Moreover, arranged on the semiconductor material or on the electrically insulating layers, as a constituent of semiconductor component body 2, there may also be at least one metal layer, composed more particularly, for example, of tungsten, titanium or titanium-tungsten alloys. In this connection, however, it should be expressly pointed out that optionally in deviation from this in any case, if nickel layer 6 is arranged on an electrically conducting layer, which may be in the form, for example, of a metal layer, and therefore has mechanical contact with this layer, this layer for the purposes of the invention is always a constituent of metallization 10 and not a constituent of semiconductor component body 2; the semiconductor material of semiconductor component body 2 for the purposes of the invention is not regarded as a layer in this case. Semiconductor component body 2 preferably has a thickness of from about 30 μm to about 700 μm and more particularly a thickness of from about 60 μm to about 300 μm.

Metallization 10 may be arranged in particular on the semiconductor material of semiconductor component body 2 and may therefore have mechanical contact with the semiconductor material of semiconductor component body 2.

Metallization 10 has an aluminum-containing first metal layer 3 arranged on semiconductor component body 2, nickel layer 6 being arranged over first metal layer 3. Metallization 10 may have an arbitrary number of electrically conducting layers, more particularly metal layers, between first metal layer 3 and nickel layer 6.

Metallization 10 may have a second metal layer 4, which is in the form of a chromium, niobium or vanadium layer, and a third metal layer 5, which is arranged on second metal layer 4 and is in the form of a copper layer, silver layer, palladium layer, iron layer or zinc layer, nickel layer 6 being arranged on third metal layer 5. Third metal layer 5 has mechanical contact with second metal layer 4.

As an alternative to this, metallization 10 may have a second metal layer 4, which is in the form of a chromium, niobium or vanadium layer, and an interlayer 13, which is arranged on second metal layer 4 and consists of nickel, titanium, titanium nitride, tungsten or tungsten nitride, and a third metal layer 5, which is arranged on interlayer 13 and is in the form of a copper layer, silver layer, palladium layer, iron layer or zinc layer, nickel layer 6 being arranged on third metal layer 5. Interlayer 13 has mechanical contact with second metal layer 4 and with third metal layer 5. Interlayer 13 preferably has a thickness of from about 200 nm to about 3000 nm and more particularly of about 1500 nm.

Metallization 10 may have an arbitrary number of electrically conducting layers, more particularly metal layers, between semiconductor component body 2 and second metal layer 4. Metallization 10 may, for example, have an aluminum-containing first metal layer 3 which is arranged on semiconductor component body 2, second metal layer 4 being arranged on first metal layer 3. First metal layer 3 may in particular be arranged on the semiconductor material of semiconductor component body 2.

Metallization 10 may have a palladium layer 7 arranged on nickel layer 6. Metallization 10 may have a gold layer 8 arranged on the palladium layer 7.

Alternatively metallization 10 may have a gold layer arranged on nickel layer 6.

It may be noted in general that all of the layers of metallization 10, including in particular nickel layer 6, may be produced, for example, by methods customary in the art and generally known for the production of layers, such as vapor deposition or sputtering, for example.

Described below in particular is an advantageous formation of the metal layers of one advantageous embodiment of metallization 10.

In a first method step for producing power semiconductor chip 1, a semiconductor component body 2 is provided. In a subsequent further method step, an aluminum-containing first metal layer 3 is applied to semiconductor component body 2, more particularly to the semiconductor material of semiconductor component body 2. First metal layer 3 consists of aluminum or of an aluminum alloy (e.g., AlSi). First metal layer 3 may be applied, for example, by an electron beam vapor deposition process. First metal layer 3 preferably has a thickness of from about 100 nm to about 8000 nm and more particularly a thickness of from about 1000 nm to about 5000 nm. First metal layer 3 has mechanical contact with semiconductor component body 2.

In a subsequent further method step, by an electron beam vapor deposition process, for example, a second metal layer 4, which is in the form of a chromium, niobium or vanadium layer, is applied to first metal layer 3. It may be noted at this point that for the purposes of the invention, a chromium, niobium or vanadium layer refers not only to a layer consisting of the chemical element in question but also to a layer consisting of an alloy of the chemical element in question with one or more other chemical elements. Second metal layer 4 preferably has a thickness of from about 10 nm to about 100 nm and more particularly a thickness of about 50 nm. Second metal layer 4 has mechanical contact with first metal layer 3.

This is followed, by means for example of an electron beam vapor deposition process, by application of a third metal layer 5, which is in the form of a copper layer, silver layer, palladium layer, iron layer or zinc layer, to second metal layer 4. It may be noted at this point that for the purposes of the invention, a copper layer, silver layer, palladium layer, iron layer or zinc layer refers not only to a layer consisting of the chemical element in question but also to a layer consisting of an alloy of the chemical element in question with one or more other chemical elements. Third metal layer 5 preferably has a thickness of from about 100 nm to about 2000 nm and more particularly a thickness of from about 600 nm to about 1500 nm. Third metal layer 5 has contact with second metal layer 4.

As an alternative to this, in the subsequent further method step, by means for example of an electron beam vapor deposition process, a second metal layer 4, which is in the form of a chromium, niobium or vanadium layer, is applied to first metal layer 3, and an interlayer 13, which consists of nickel, titanium, titanium nitride, tungsten or tungsten nitride, is applied to second metal layer 4, and a third metal layer 5, which is in the form of a copper layer, silver layer, palladium layer, iron layer or zinc layer, is applied to interlayer 13.

This is followed by current-based electroplating application of a nickel layer 6 to third metal layer 5. For this purpose, the elements of the power semiconductor chip present so far, with the exception of third metal layer 5, are preferably covered with an electrically insulating protective varnish. Third metal layer 5, which in electroplating forms the cathode, is subsequently placed in electrically conducting connection to the negative electrical terminal of a voltage source. The elements of the power semiconductor chip present so far are subsequently immersed in an electrolyte.

A suitable electrolyte for the current-based electroplating application of nickel layer 6 is, for example, a mixture of nickel(II) chloride hexahydrate $NiCl_2*6H_2O$, nickel(II) sulphate heptahydrate $NiSO_4*7H_2O$ and boric acid $(H_3BO_3)$. The anode which is connected to the positive electrical terminal of the voltage source may take the form, for example, of a soluble anode and consists of nickel, which may be present for example in the form of granules of bulk material.

Nickel layer 6 has mechanical contact with third metal layer 5.

The interlayer sequence, consisting of second and third metal layers 4 and 5, allows very good indirect connection of nickel layer 6 to first metal layer 3. Nickel layer 6 is connected in a mechanically very stable way to first metal layer 3, via second and third metal layers 4 and 5. The layer sequence of the invention, consisting of second and third metal layers 4 and 5 and of nickel layer 6, is therefore particularly mechanically robust, thus allowing even a copper wire 11 (see FIG. 2), provided without a thick and, in particular, soft metallic coating, to be bonded, in particular by ultrasonic wedge bonding, to nickel layer 6 of metallization 10 in a particularly reliable manner, by an ultrasonic bonding procedure, for example.

The alternative interlayer sequence, consisting of second and third metal layers 4 and 5 and interlayer 13, permits an extremely good indirect connection of nickel layer 6 to first metal layer 3. Nickel layer 6 is connected in a mechanically very stable way to first metal layer 3 via second metal layer 4, via interlayer 13 and via third metal layer 5. The alternative layer sequence of the invention, consisting of second and third metal layers 4 and 5 and of interlayer 13 and of nickel layer 6, is therefore extremely mechanically robust, allowing even a copper wire 11 (see, FIG. 2) provided without a thick and, in particular, soft metallic coating to be bonded, more particularly by ultrasonic wedge bonding, to nickel layer 6 of metallization 10 in a particularly reliable manner, by an ultrasonic bonding procedure, for example.

As an alternative to this, the application of second and third metal layers 4 and 5 may also be omitted, and, after the application of the aluminum-containing first metal layer 3 to semiconductor component body 2, a nickel layer 6 may be applied by current-based electroplating to first metal layer 3. In this case the thickness of nickel layer 6 ought preferably to be thicker than when second and third metal layers 4 and 5 and, optionally, interlayer 13 are present, and therefore ought preferably to be applied by current-based electroplating more thickly than when second and third metal layers 4 and 5 are present. In the case of this alternative, nickel layer 6 has mechanical contact with first metal layer 3.

Nickel layer 6 preferably has a thickness of at least about 5 µm, more particularly a thickness of at least about 10 µm. Nickel layer 6 may, for example, have a thickness of about 5 µm to about 50 µm. In the exemplary embodiment, nickel layer 6 has a thickness of about 20 µm. By virtue of the current-based electroplating application of nickel layer 6, in accordance with the invention, this layer can be applied particularly thickly, economically and without stress for semiconductor component body 2 (no exposure to heat, radiation, pressure and/or temperature) relative to processes customary in the art (sputtering, etc.) for the application of metal layers, and so nickel layer 6 has particular mechanical stability.

In a subsequent further method step, for the purpose of preventing oxidation of nickel layer 6, for example, a palladium layer 7 may be applied to nickel layer 6, and subsequently, in a further method step, a gold layer 8 may be applied to palladium layer 7. The application of palladium layer 7 and of gold layer 8 may take place, for example, by a standard ENIPIG process (Electroless Nickel Immersion Palladium Immersion Gold). The gold prevents catalytic accumulation of carbon on the palladium. Palladium layer 7 has mechanical contact with nickel layer 6. Gold layer 8 has contact with palladium layer 7. Palladium layer 7 preferably has a thickness of from about 5 nm to about 100 nm, more particularly of from about 10 nm to about 60 nm. Gold layer 8 preferably has a thickness of from about 10 nm to about 200 nm, more particularly of from about 20 nm to about 120 nm.

As an alternative to this, in the subsequent further method step, it is also possible for a gold layer 8 to be applied directly to nickel layer 6 (not shown in the figures). This may take place, for example, by a standard ENIG process (Electroless Nickel Immersion Gold). Gold layer 8 in this case has mechanical contact with nickel layer 6. In this case gold layer 8 arranged on the fourth metal layer 6 preferably has a thickness of from about 20 nm to about 150 nm, more particularly of from about 50 nm to about 100 nm.

Palladium layer 7 consists of palladium, and gold layer 8 consists of gold.

Figure 2:
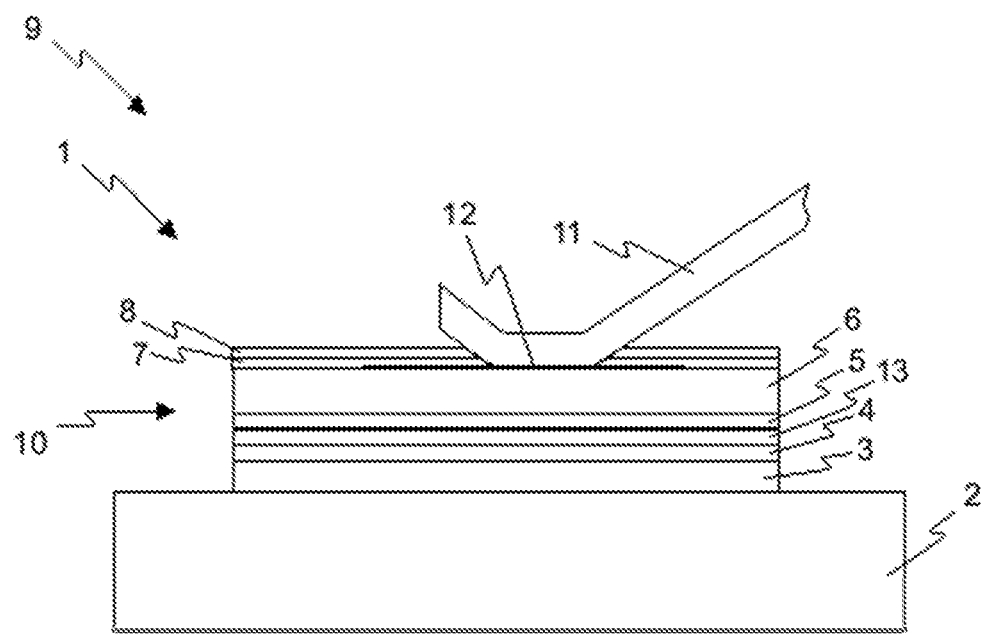
FIG. 2 shows a sectional view of a power semiconductor device having a power semiconductor chip of the invention with a copper wire bonded to its metallization.

FIG. 2 shows a sectional view of a power semiconductor device 9 comprising a power semiconductor chip 1 of the invention, with a copper wire 11 bonded, more particularly ultrasonically bonded, to nickel layer 6 of metallization 10 on power semiconductor chip 1.

It may be noted at this point that for the purposes of the invention, a copper wire is a wire consisting of copper or of a copper alloy whose principal constituent is copper. This copper wire may optionally be coated, for protection from oxidation, for example, with at least one thin coating which, when the copper wire 11 is bonded to metallization 10 of power semiconductor chip 1, is abraded away by the rapid vibrational movement of copper wire 11 in the region of contact of copper wire 11 with metallization 10 of power semiconductor chip 1. Copper wire 11 preferably has a diameter of from about 100 µm to about 500 µm. In the exemplary embodiment, copper wire 11 has a diameter of about 300 µm.

Described hereinafter is a method for producing power semiconductor device 9, wherein the method for producing power semiconductor device 9 embraces the above-described method for producing power semiconductor chip 1, and, after the method for producing power semiconductor chip 1, there is bonding, more particularly ultrasonic bonding, more particularly ultrasonic wedge bonding, of copper wire 11 to metallization 10, and, after the bonding has taken place, the copper of copper wire 11 has contact with metallization 10 of copper wire 11. In the exemplary embodiment, during the bonding of copper wire 11 to metallization 10 of power semiconductor chip 1, gold layer 8, where present, and palladium layer 7, where present, are abraded away by the rapid vibrational movement of copper wire 11, and so the bonding, more particularly the ultrasonic bonding, of copper wire 11 takes place to nickel layer 6 of metallization 10. The copper of copper wire 11 here has contact with the nickel of nickel layer 6. The contact of the copper of copper wire 11 with the nickel of nickel layer 6 is present here generally in the form of an intermetallic phase 12 or alloy 12 formed from the copper of copper wire 11 and from the nickel of nickel layer 6. Surprisingly for the person skilled in the art, the effect that occurs here is that the bonding, more particularly the ultrasonic bonding, of copper wire 11 to nickel layer 6 produces an extremely robust bonded copper-nickel connection. This bonding, more particularly ultrasonic bonding, of copper wire 11 to nickel layer 6 may take place with relatively low pressure exposure of copper wire 11, and hence during bonding, more particularly ultrasonic bonding, damage to power semiconductor chip 1 and especially to semiconductor component body 2 is avoided. Furthermore, relative to a copper layer as the bonded connecting layer of the metallization, a nickel layer has the advantage of greater mechanical stability, allowing nickel 6 layer, assuming equal layer thickness, to be exposed to a greater pressure when bonding than a copper layer.

It may, however, be expressly noted at this point once again, very generally, that in the context of the invention, all layers of metallization 10, including in particular nickel layer 6, can be produced by methods customary in the art and generally known for the production of layers, such as vapor deposition or sputtering, for example. Essential to the invention is that metallization 10 comprises a nickel layer 6, thus producing a nickel layer to which copper wire 11 can be bonded, more particularly ultrasonically bonded. The copper of copper wire 11 here has contact with the nickel of nickel layer 6. The contact of the copper of copper wire 11 with the nickel of nickel layer 6 here is present generally in the form of an intermetallic phase 12 or alloy 12 formed from the copper of copper wire 11 and from the nickel of nickel layer 6. Surprisingly for the person skilled in the art, the effect that occurs here is that the bonding, more particularly the ultrasonic bonding, of copper wire 11 to nickel layer 6 produces an extremely robust bonded copper-nickel connection. All other layers of metallization 10 may in the context of the invention be formed in any way, with the remaining layers indicated and the layer sequences indicated being particularly advantageous in this case. Moreover, the indicated production of the layers of metallization 10 is also particularly advantageous.

It may be noted at this point that, of course, features of different exemplary embodiments of the invention may be combined arbitrarily with one another, provided that the features are not mutually exclusive.

It may be noted that nickel layer 6 consists at least substantially of nickel. It may further be noted that nickel layer 6 preferably consists of nickel and, if it consists of nickel, has more particularly a nickel content of more than 99.9 weight percent nickel.

In the preceding Detailed Description, reference was made to the accompanying drawings, which form a part of this disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor device comprising:
   a power semiconductor chip, said power semiconductor chip including
   a semiconductor component body;
   a multilayer metallization arranged on said semiconductor component body, said multilayer metallization including
   a first metal layer containing aluminum arranged on said semiconductor component body;
   a second metal layer containing chromium arranged on said first metal layer;
   an interlayer consisting of nickel arranged on said second metal layer; and
   a third metal layer containing silver arranged on said interlayer; and
   a nickel layer arranged over said semiconductor component body and said first metal layer, and on said third metal layer, said nickel layer having a thickness of at least 5 µm;
   a palladium layer arranged on said nickel layer; and
   a gold layer arranged on said palladium layer; and
   a copper wire, said copper wire being bonded to said nickel layer, said copper of said copper wire having contact with said nickel of said nickel layer.

2. The power semiconductor device of claim 1, wherein said copper wire is ultrasonically bonded to said nickel layer.

3. The power semiconductor chip of claim 1, wherein said interlayer has a thickness of from about 200 nm to about 3000 nm.

4. The power semiconductor chip of claim 1, wherein said second metal layer has a thickness of from about 10 nm to about 100 nm.

5. The power semiconductor chip of claim 1, wherein said third metal layer has a thickness of from about 100 nm to about 2000 nm.

* * * * *